| (12) | United States Patent | (10) Patent No.: | US 9,373,923 B2 |
|---|---|---|---|
| | Bobbitt, III | (45) Date of Patent: | Jun. 21, 2016 |

(54) RAPID PROTOTYPE EXTRUDED CONDUCTIVE PATHWAYS

(71) Applicant: Savannah River Nuclear Solution, LLC, Aiken, SC (US)

(72) Inventor: John T. Bobbitt, III, Evans, GA (US)

(73) Assignee: SAVANNAH RIVER NUCLEAR SOLUTIONS, LLC, Aiken, SC (US)

( * ) Notice: Subject to any disclaimer, the term of this patent is extended or adjusted under 35 U.S.C. 154(b) by 666 days.

(21) Appl. No.: 13/675,434

(22) Filed: Nov. 13, 2012

(65) Prior Publication Data

US 2013/0127083 A1    May 23, 2013

Related U.S. Application Data

(60) Provisional application No. 61/562,784, filed on Nov. 22, 2011.

(51) Int. Cl.
| *B29C 70/88* | (2006.01) |
|---|---|
| *H01R 43/00* | (2006.01) |
| *B29C 67/00* | (2006.01) |
| *H05K 3/00* | (2006.01) |
| *H05K 3/12* | (2006.01) |
| *B82Y 30/00* | (2011.01) |

(52) U.S. Cl.
CPC ............ *H01R 43/00* (2013.01); *B29C 67/0055* (2013.01); *B29C 67/0059* (2013.01); *B29C 67/0062* (2013.01); *B29C 67/0066* (2013.01); *B29C 67/0077* (2013.01); *B29C 67/0081* (2013.01); *B29C 70/885* (2013.01); *H05K 3/0014* (2013.01); *H05K 3/12* (2013.01); *B82Y 30/00* (2013.01); *H05K 3/125* (2013.01); *H05K 2203/013* (2013.01); *Y10S 977/734* (2013.01); *Y10S 977/742* (2013.01)

(58) Field of Classification Search
CPC ...... H01R 3/00; B29C 67/0051; B29C 67/00; B29C 67/0055; B29C 67/0059; B29C 67/0062; B29C 67/0066; B29C 67/007; B29C 67/0074; B29C 67/0077; B29C 67/0081; B29C 67/0085; B29C 67/0088; B29C 67/0092; B29C 67/0096; B29C 70/88; B29C 70/882; B29C 70/885; B32B 38/10; C08L 3/02; H05K 3/0014; H05K 3/12; H05K 3/125; H05K 3/1275; H05K 2203/13
USPC .......... 264/401, 308, 104, 105, 113, 255, 497
See application file for complete search history.

(56) References Cited

U.S. PATENT DOCUMENTS

| 4,585,407 | A | 4/1986 | Silver | |
|---|---|---|---|---|
| 5,108,270 | A | 4/1992 | Kozumplik, Jr. | |
| 5,133,120 | A | 7/1992 | Kawakami | |
| 5,925,414 | A | 7/1999 | Buechele | |
| 6,132,510 | A | 10/2000 | Buechele | |
| 6,363,606 | B1 * | 4/2002 | Johnson et al. | 29/854 |
| 6,951,233 | B1 | 10/2005 | Calvar | |
| 7,722,802 | B2 | 5/2010 | Pfeifer et al. | |
| 7,896,639 | B2 | 3/2011 | Kritchman et al. | |
| 2006/0063060 | A1 | 3/2006 | Murphy | |
| 2006/0100298 | A1 * | 5/2006 | Ulrich et al. | 522/26 |
| 2010/0055895 | A1 * | 3/2010 | Zafiropoulo et al. | 438/613 |

FOREIGN PATENT DOCUMENTS

DE    102007015389 A1 *   1/2007

OTHER PUBLICATIONS

Periard D., Malone E., Lipson H., "Printing Embedded Circuits", ( Aug. 2007) Proceedings of the 18th Solid Freeform Fabrication Symposium, pp. 503-512.*
Nadkarni Sarosh S. et. al., "Concentrated Titanate Colloidal Gels Prepared by Bridging Flocculation for Use in Solid Freehorm Fabrication", (2006), J. Am. Ceram. Soc., 89 [1], 96-103.*
Thomas, et al.; Electrodeposition of Nickel into Molds produced via Rapid Prototyping; NCUR 2008; Apr. 12-14, 2008; 7 pages.
OPTOMEC; "Aerosol Jet Printed Electronics Overview"; www.optomec.com. Aerosol Jet; 6 pages; "undated".

* cited by examiner

*Primary Examiner* — Leo B Tentoni
(74) *Attorney, Agent, or Firm* — J. Bennett Mullinax, LLC

(57) ABSTRACT

A process of producing electrically conductive pathways within additively manufactured parts and similar parts made by plastic extrusion nozzles. The process allows for a three-dimensional part having both conductive and non-conductive portions and allows for such parts to be manufactured in a single production step.

8 Claims, No Drawings

RAPID PROTOTYPE EXTRUDED CONDUCTIVE PATHWAYS

RELATED APPLICATIONS

This application claims the benefit of U.S. Application Ser. No. 61/562,784, entitled "Rapid Prototype Extruded Conductive Pathways", filed on Nov. 22, 2011, and which is incorporated herein by reference.

STATEMENT AS TO RIGHTS TO INVENTIONS MADE UNDER FEDERALLY SPONSORED RESEARCH AND DEVELOPMENT

This invention was made with Government support under Contract No. DE-AC09-08SR22470 awarded by the United States Department of Energy. The Government has certain rights in the invention.

FIELD OF THE INVENTION

This invention is directed towards a process of producing electrically conductive pathways within rapid prototyping parts and similar parts made by plastic extrusion nozzles. The process allows for a three-dimensional part having both conductive and non-conductive portions and allows for such parts to be manufactured in a single production step.

BACKGROUND OF THE INVENTION

This invention relates generally to products and substrates having conductive and non-conductive portions. Representative patents on materials having conductive and non-conductive portions include:

U.S. Pat. No. 6,951,233 to Calvar discloses materials having a conductive band within a non-conductive material. The process allows extrusion of conductive and non-conductive materials at the same time but extrudes materials in a straight line and does not offer an ability to extrude complicated conductive shapes and traces.

U.S. Pat. No. 4,858,407 is directed to extruding semi-conductive and non-conductive heat layers on an electrical cable. The extruded layers are essentially cylinders and are concentric. There is no inter-mixing of materials and non-linear products can not be made.

U.S. Pat. No. 5,133,120 provides a method to fill a hole on a circuit board with a conductive paste. The conductive paste joins conductive layers within the circuit board following circuit board production.

U.S. Pat. Nos. 5,925,414 and 6,132,510 are directed to extruding a conductive paste through a stencil or screen onto an essentially planar surface. The method within these patents will not produce a three-dimensional conductive pathway or permit formation of a desired part in, a single step.

U.S. Application 2006/0063060 teaches extrusion of a conductive material such as graphite through a non-conductive substrate to produce conductive pathways through a substrate. The extrusion is a secondary process that requires assembly of the graphite substrate and non-conductive substrate.

There remains room for improvement in variation within the art.

SUMMARY OF THE INVENTION

It is one aspect of one of the present embodiments to provide for a method and process of producing an electrically conductive pathway within a three-dimensional part made by a rapid prototype extrusion machine or a rapid additive manufacturing machine.

It is a further aspect of at least one of the present embodiments of the invention to provide for a process and method extrude a part having conductive and non-conductive material made by selectively extruding conductive materials within desired regions on each layer of the part. The extrusion of the conductive material may be made through the use of a separate extruder head containing a conductive material.

It is a further aspect of at least one of the present embodiments to provide for a three-dimensional substrate having conductive and non-conductive electrical pathways in which the conductive portions are formed through the addition of a conductive material during extrusion, the conductive material including conductive metals such as stainless steel fibers, copper fibers, other metallic fibers, or the use of non-metallic conductive materials such as carbon, carbon nano tubes, carbon nanoparticles and conductive polymers.

It is a further aspect of at least one of the present embodiments of the present invention to provide for an electrically conductive pathway within a three-dimensional extruded part using conductive powder layers applied during extrusion of a part. As used herein, the term "three-dimensional" additionally includes three-dimensional substrates that have a non-uniform shape or geometry with respect to either the final substrate shape and/or to the shape of a respective conductive or non-conductive region or regions within the substrate.

It is a further aspect of at least one of the present embodiments of the present invention to provide for an electrically conductive pathway within a three-dimensional part, which the part is created by a plurality of layers of powders held together with a binder, usually applied in an ink jet manner. When desired, the binder can include a conductive filler, such conductive fillers including nano tubes. The process allows conductive pathways to be printed and/or within the part created by the sequential formation of the respective powder layers and binders, using conductive and non-conductive binder as appropriate to create the conductive pathways.

It is a further aspect of at least one of the present embodiments of the present invention to provide for a process of providing a three-dimensional part having selected areas of electrical conductivity and non-conductivity comprising the steps of:

supplying one of either a rapid prototype extrusion machine or a rapid additive manufacturing machine; and extruding a three-dimensional part comprising a first portion which is electrically non-conductive and a second portion which is electrically conductive, the second portion including a mixture of a non-conductive substrate with an electrically conductive substrate.

It is a further aspect of at least one of the present embodiments of the present invention to provide for a process of providing a multi-layered object having areas of electrical conductivity and electrical non-conductivity comprising the steps of:

forming a non-conductive substrate by the deposition of multiple substrate layers;

integrating within the multiple substrate layers of the non-conductive substrate at least one three-dimensional region of a conductive substrate, the conductive substrate applied by one of the either stereo lithography, laser sintering, ink-jet printing, or fused deposition;

wherein the multi-layered object has a three-dimensional electrical conductive portion within the non-conductive substrate.

These and other features, aspects, and advantages of the present invention will become better understood with reference to the following description and appended claims.

DESCRIPTION OF THE PREFERRED EMBODIMENT

Reference will now be made in detail to the embodiments of the invention, one or more examples of which are set forth below. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used on another embodiment to yield a still further embodiment. Thus, it is intended that the present invention cover such modifications and variations as come within the scope of the appended claims and their equivalents. Other objects, features, and aspects of the present invention are disclosed in the following detailed description. It is to be understood by one of ordinary skill in the art that the present discussion is a description of exemplary embodiments only and is not intended as limiting the broader aspects of the present invention, which broader aspects are embodied in the exemplary constructions.

In accordance with this invention, any number of rapid prototyping apparatuses can be modified as set forth herein to carry out a process for formation of a three-dimensional object having conductive and non-conductive portions therein. U.S. Pat. No. 7,896,639 to Objet Geometries Ltd. describes an apparatus using multiple printing heads for sequentially forming thin layers for a construction material in response to computer controlled data. U.S. Pat. No. 7,896,639 is incorporated herein by reference. Using one or more print heads, as described in the above-referenced application, to dispense a conductive material either in the form of a powder, a binder, or a polymer, a conductive region can be formed in a three-dimensional structure. Suitable conductive powders, binders, or polymers may include carbon nano tubes or fine metallic particles or fibers that are dispensed through the printing heads so as to construct a conductive portion within a three-dimensional part.

U.S. Pat. No. 7,722,802, which is incorporated herein by reference, describes a powder based rapid generative prototyping method. The teachings and methodology described in the '802 patent can be modified as described below in accordance with the present invention.

By controlling the sequential deposition of a conductive powder material, which may include metals, conductive polymers, or a conductive carbon substrate, a three-dimensional body having conductivity there through may be provided. Alternatively, a non-conductive powder may be deposited in and bound together with selectively applied conductive and non-conductive binder. In general, additive manufacturing (AM) represents a technology field that can be used to form three-dimensional objects for solid images. In general, AM techniques build three-dimensional objects, layer by layer, from a building medium using data representing successive cross-sections of the object to be formed. The four primary modes of AM include stereo lithography, laser sintering, ink jet printing of solid images, and fused deposition modeling.

In accordance with the present invention, it is recognized that the present technology directed to using thin layers to form solid structures can be modified such that a portion of the applied thin layers may include conductive materials such as steel wool, copper fibers, other metal fibers, and non-metallic conductive substrates such as carbon based materials including carbon nano tubes or conductive polymers. Suitable conductive polymers which can be applied by one or more of the methodologies described herein include various linear-backbone polymer compounds including polyacetylene, polypyrrole, polyaniline, and their co-polymers and which include various melanins. Included among suitable conductive polymers are poly(fluorine)s, polyphenylenes, polypyrenes, polyazulenes, polynaphthalenes, poly(acetylene)s, poly(p-phenylene vinylene), poly(pyrrole)s, polycarbazoles, polyindoles, polyazepines, polyanilines, poly(thiophene)s, poly(3,4-ethylenedioxythiophene), poly(p-phenylene sulfide), and combinations thereof. Depending upon the nature of the conductive polymer, suitable applicators can be used based upon the material of choice. Various binders including electrically-conductive materials can also be added to the conductive polymers to enhance the use, application, or electrical-conductivity properties.

By applying such conductive materials within a precise location and geometry, a three-dimensional object having an electrical pathway there through can be provided. Using a similar approach, an electrically conductive object may have an appropriate layer of non-conductive material added where needed as an insulator.

The present process allows for rapid production of a part and/or a prototype in which the electrical properties of the part may be evaluated as well as a more traditional mechanical attributes of the part. The present invention lends itself to the production of integrated circuits within a rapid prototype part of the formation of a rapid prototype circuit board. Any three-dimensional part that lends itself to production through AM processes may be modified such that a component of the three-dimensional structure is supplied through an electrically conductive material. As a result, increased functionality of a prototype can be provided. In addition, to the extent the AM is used to manufacture production parts, technology allows an improved way of supplying three-dimensional parts which require defined pathways of conductive and non-conductive regions.

The present process also lends itself to the production of parts that are more difficult to reverse engineer. A traditional electrically wired device can easily be reverse engineered by tracing the wiring configuration. Even for parts that are concealed within a housing which is designed to render inoperative if the housing is removed, reverse engineering can still be accomplished by the use of x-rays or other imaging technology. For some products, the external housing can be melted or dissolved in an effort to preserve the integrity of the sealed interior portion.

The present invention is more resistant to reverse engineering. While x-rays can be used to determine varying density within the extruded layers, it is possible to provide additives to the various insulating and detector materials such that the layers are not readily differentia table using imaging technology such as x-rays. Absent imaging technology, a physical removal of layers is needed which is more difficult and costly. It is possible to match to colors of the various conductive and non-conductive portions such that visual reconstruction of various layers is not readily apparent.

As a result of using conductive and non-conductive materials having similar densities and colors, one can make the reverse engineering process much more complicated. Such capabilities are a useful aspect for certain embodiments of the present invention.

Although preferred embodiments of the invention have been described using specific terms, devices, and methods, such description is for illustrative purposes only. The words used are words of description rather than of limitation. It is to be understood that changes and variations may be made by those of ordinary skill in the art without departing from the spirit or the scope of the claims of the present invention. In addition, it should be understood that aspects of the various embodiments may be interchanged, both in whole, or in part. Therefore, the spirit and scope of the invention should not be limited to the description of the preferred versions contained therein.

The invention claimed is:

1. A process of providing a three-dimensional part having selected areas of electrical conductivity and non-conductivity comprising the steps of:
supplying one of either a rapid prototype extrusion machine or a rapid additive manufacturing machine;
extruding a three-dimensional part comprising a first portion which is electrically non-conductive and a second portion which is electrically conductive, the second portion including a mixture of a non-conductive substrate with an electrically conductive substrate and wherein an x-ray additive is incorporated into at least one of the electrical non-conductive portion or the electrical conducting portions so that a resulting x-ray density of the non-conducting portions and the conducting portions is substantially uniform.

2. A process of providing a multi-layered object having areas of electrical conductivity and electrical non-conductivity comprising the steps of:
forming a substrate by the deposition of multiple substrate layers;
integrating within the multiple substrate layers at least one three-dimensional region of a non-conductive substrate and at least one three-dimensional region of a conductive substrate, the conductive substrate applied by one of the either stereo lithography, laser sintering, ink-jet printing, or fused deposition and having an x-ray density substantially identical to an x-ray density of the non-conducting substrate;
wherein the multi-layered object has a three-dimensional electrical conductive portion within the non-conductive substrate.

3. The process according to claim 1 wherein the electrically conductive portion further comprises a conductive material selected from group consisting of metal fibers, steel wool, carbon, carbon nanostructures, carbon nano tubes, metallic powders, conductive polymers, and combinations thereof.

4. The process of claim 2 wherein the step of integrating at least one three-dimensional region of a conductive binder further comprises providing a conductive substrate comprising a conductive material selected from the group consisting of metal fibers, steel wool, carbon, carbon nanostructures, carbon nano tubes, metallic powders, conductive polymers, and combinations thereof.

5. The process according to claim 1 wherein the extruding step further includes the step of combining a coloring agent to at least one of the electrically conductive or the electrically non-conductive portions so that a color of the conductive and non-conductive portions is essentially uniform.

6. The process according to claim 2 comprising the additional step of adding a coloring agent to at least one of the non-conductive substrate or the conductive substrate such that the color of the conductive and non-conductive regions are essentially uniform.

7. A process of providing a three dimensional object having a selected area of electrically conductive portion and a selected area of a non-conducting portion comprising the steps of:
supplying a rapid prototype extrusion machine;
extruding a three dimensional object wherein a first portion is electrically non-conductive and has an x-ray density, the three dimensional object having a second portion which is electrically conductive, the second portion having an x-ray density equal to the x-ray density of the non-conducting portion.

8. The process according to claim 7, wherein the three dimensional object has a uniform x-ray density achieved by adding an x-ray density additive.

* * * * *